(12) United States Patent
Lee

(10) Patent No.: US 7,143,509 B2
(45) Date of Patent: Dec. 5, 2006

(54) CIRCUIT BOARD AND PROCESSING METHOD THEREOF

(75) Inventor: I-Tseng Lee, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 11/140,708

(22) Filed: May 31, 2005

(65) Prior Publication Data

US 2006/0112548 A1   Jun. 1, 2006

(30) Foreign Application Priority Data

Nov. 26, 2004   (TW) ............................... 93136441 A

(51) Int. Cl.
*H01K 3/10* (2006.01)
(52) U.S. Cl. ............................ 29/852; 29/825; 29/830; 29/846
(58) Field of Classification Search ................. 29/825, 29/830, 846, 852
See application file for complete search history.

(56) References Cited

U.S. PATENT DOCUMENTS

| | | | | |
|---|---|---|---|---|
| 4,915,983 A * | 4/1990 | Lake et al. | ................. | 430/314 |
| 5,567,329 A * | 10/1996 | Rose et al. | ................... | 216/18 |
| 5,731,047 A * | 3/1998 | Noddin | ........................ | 427/555 |
| 5,863,446 A * | 1/1999 | Hanson | ........................ | 216/16 |
| 5,868,950 A * | 2/1999 | Noddin | ......................... | 216/18 |
| 5,910,255 A * | 6/1999 | Noddin | ......................... | 216/18 |
| 6,376,049 B1 * | 4/2002 | Asai et al. | .................. | 428/209 |
| 6,376,052 B1 * | 4/2002 | Asai et al. | .................. | 428/209 |
| 6,413,620 B1 * | 7/2002 | Kimura et al. | ............. | 428/210 |
| 6,534,723 B1 | 3/2003 | Asai et al. | .................. | 174/255 |
| 6,768,061 B1 | 7/2004 | Kondo | ....................... | 174/255 |
| 6,849,945 B1 * | 2/2005 | Horiuchi et al. | ............ | 257/735 |
| 6,930,258 B1 * | 8/2005 | Kawasaki et al. | .......... | 174/264 |

* cited by examiner

*Primary Examiner*—Carl J. Arbes
(74) *Attorney, Agent, or Firm*—J.C. Patents

(57) ABSTRACT

A circuit board essentially comprises a first laminated structure, at least a first plated through hole, at least a second laminated structure, a middle dielectric layer and at least a second plated through hole is disclosed. The first laminated structure has at least three first circuit layers and at last two first dielectric layers. The first circuit layers and the first dielectric layers are alternately laminated and any two adjacent first circuit layers have a first dielectric layer disposed between them. The first plated through hole passes through the first laminated layer. The second laminated structure is laminated over the first laminated structure. The middle dielectric layer is disposed between the first laminated structure and the second laminated structure. The second plated through hole passes through the first laminated structure, the middle dielectric layer and the second laminated structure.

20 Claims, 5 Drawing Sheets

CIRCUIT BOARD AND PROCESSING METHOD THEREOF

CROSS-REFERENCE TO RELATED APPLICATION

This application claims the priority benefit of Taiwan application serial no. 93136441, filed on Nov. 26, 2004. All disclosure of the Taiwan application is incorporated herein by reference.

BACKGROUND OF THE INVENTION

1. Field of the Invention

The present invention relates to a circuit board and processing method thereof. More particularly, the present invention relates to a circuit board and processing method thereof that can increase the wiring density of the circuit board.

2. Description of the Related Art

In today's information critical society, the market for electronic devices that facilitate information exchange expands at a tremendous pace. To increase the processing speed, provide more powerful functions, raise the level of integration and miniaturization and lower the selling price, chip packaging techniques are all aiming toward a higher degree of miniaturization and a higher degree of packaging density. In order to match this trend, the carrier in chip packaging, in particular, the ball grid array (BGA) and the pin grid array (PGA), has a higher integration level of wiring layout. Because a rigid substrate can provide a circuit layout with a higher wiring density and a higher pin count, it has become one of the most commonly used carriers in high-density chip packaging production. At present, the processes of fabricating a multi-layered rigid substrate having organic dielectric material layer can be categorized into the lamination method and the build-up method.

FIG. 1 is a schematic cross-sectional view of a conventional laminated circuit substrate. As shown in FIG. 1, the circuit substrate 100 mainly comprises a plurality of circuit layers 112, 114, 116, 118, a plurality of dielectric layers 122, 124, 125, two solder mask layers 132, 134 and a plurality of plated through holes (PTHs) 140. The circuit layers 112~118 and the dielectric layers 122~126 are alternately laminated over each other. The two solder mask layers 132, 134 are disposed on the topmost circuit layer 112 and the bottommost circuit layer 118 respectively to expose a portion of each of the circuit layers 112 and 118 so that they can connect electrically with a chip or other carrier in a subsequent operation. The plated through holes 140 pass through the circuit layers 112~118 and the dielectric layers 122~126, and electrically connect with the circuit layers 112~118.

The conventional method of forming the plated through holes 140 includes performing a mechanical drilling process to form a plurality of through holes passing through various layers after the circuit layers 112~118 and the dielectric layers 122~126 are pressed together. Thereafter, the through holes are filled using a conductive material. Since the drilling density in all circuit layers 112~118 is identical, the circuit wiring area between the top circuit layer 112 and the bottom circuit layer 118 is reduced. Thus, some of the circuits is forced to route through the inner circuit layers 114 and 116 and damage the integrity of the circuit layers 114 and 116 for serving as a ground plane and a power plane. In other words, the electrical performance of the circuit board 100 is compromised. Similarly, too high a drilling density in the inner circuit layer 114 and 116 will also lead to the aforementioned problem. In addition, routing the circuit lines is increasingly difficult when the density of drilled holes in the laminated circuit board 100 is too high. In some cases, even the costlier built-up type of circuit board or a laminated circuit board with more layers is required.

SUMMARY OF THE INVENTION

Accordingly, at least one objective of the present invention is to provide a circuit board suitable for increasing wiring integration and lowering production cost.

At least a second objective of the present invention is to provide a circuit board process suitable for increasing the wiring integration and lowering production cost.

To achieve these and other advantages and in accordance with the purpose of the invention, as embodied and broadly described herein, the invention provides a circuit board fabrication process. First, a first laminated structure is provided. The first laminated structure has at least three first circuit layers and two first dielectric layers. The first circuit layers and the first dielectric layers are alternately laminated and any two adjacent first circuit layers have a first dielectric layer disposed between them. The first dielectric layers do not have a conductive via that passes through single first dielectric layer only. At least a first plated through hole (PTH) that passes through the first laminated structure is formed. Thereafter, a middle dielectric layer and a second laminated structure are laminated over the first laminated structure. The middle dielectric layer is disposed between the first laminated structure and the second laminated structure. Finally, at least a second plated through hole (PTH) that pass through the first laminated structure, the middle dielectric layer and the second laminated structure is formed.

The present invention also provides a circuit board comprising a first laminated structure, at least a first plated through hole (PTH), at least a second laminated structure, a middle dielectric layer and at least a second plated through hole (PTH). The firs laminated structure has at least three first circuit layers and at least two first dielectric layers. The first circuit layer and the first dielectric layer are alternately laminated and any two adjacent first circuit layers have a first dielectric layer disposed between them. The first dielectric layers do not have a conductive via that passes through single first dielectric layer only. The first plated through hole passes through the first laminated structure. The second laminated structure has at least a second circuit layer. The second laminated structure is laminated above the first laminated structure. The middle dielectric layer is disposed between the first laminated structure and the second laminated structure. The second plated through hole passes through the first laminated structure, the middle dielectric layer and the second laminated structure.

In brief, the process of fabricating the circuit board includes forming a portion of the laminated layer of the circuit board such as the alternately laminated three circuit layers and the two dielectric layers and the first plated through holes before pressing the remaining laminated layers together. Thereafter, a second plated through hole that passes through all the layers of the circuit board is formed. In other words, not all of the plated through holes passes through each circuit layer of the completed circuit board, thereby minimizing the waste in area utilization due to the presence of the plated through holes. Ultimately, the degree of integration of wiring layout is increased and overall production cost is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
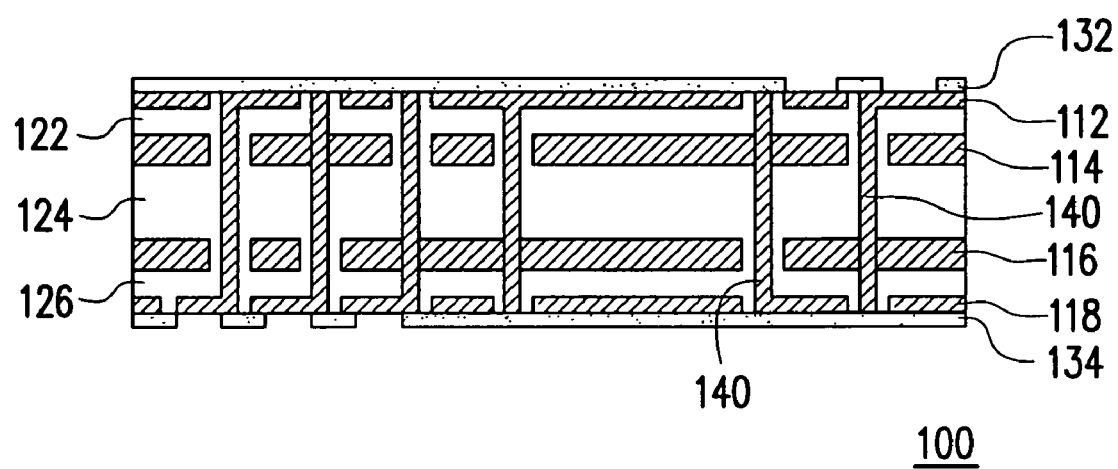
FIG. 1 is a schematic cross-sectional view of a conventional laminated circuit substrate.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
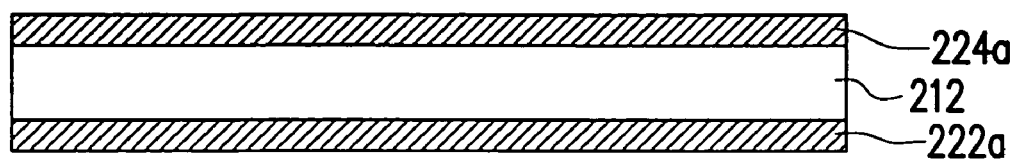
FIGS. 2A through 2G are schematic cross-sectional views showing the steps for fabricating a circuit board according to one preferred embodiment of the present invention.

FIGS. 2A through 2G are schematic cross-sectional views showing the steps for fabricating a circuit board according to one preferred embodiment of the present invention. As shown in FIG. 2A, the process of fabricating a circuit board in the present invention includes providing a dielectric layer 212 and two conductive layers 222a and 224a. The conductive layers 222a and 224a are disposed on each side of the dielectric layer 212. The conductive layers 222a and 224a are copper foils disposed on the surfaces of the dielectric layer 212 by the lamination method, for example.

Figure 2B:
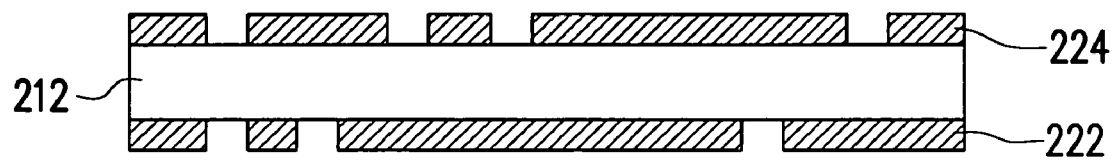

As shown in FIG. 2B, photolithographic and etching techniques are applied to pattern the conductive layer 222a and 224a into a first circuit layer 222 and a second circuit layer 224 respectively.

Figure 2C:
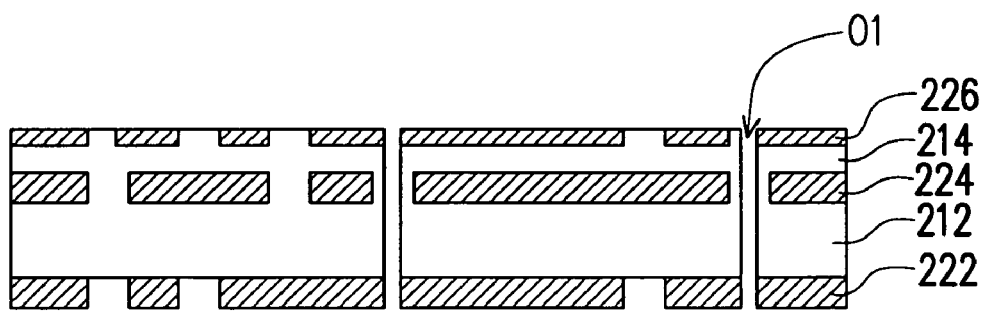

As shown in FIG. 2C, a dielectric layer 214 and a circuit layer 226 are sequentially laminated over the circuit layer 224. The dielectric layer 214 is disposed between the circuit layer 226 and the circuit layer 224. The dielectric layer 214 includes none of the conductive via that only passes through a single dielectric layer. Obviously, the circuit layer 226 is formed in the same way as the circuit layers 222 and 224, that is, by patterning a conductive layer. In fact, all subsequently formed circuit layers are formed in a similar way. Thereafter, a through hole O1 that passes through the circuit layers 222, 224, 226 and the dielectric layers 212, 214 are formed. The method of forming the through hole O1 includes mechanical drilling, for example.

Figure 2D:
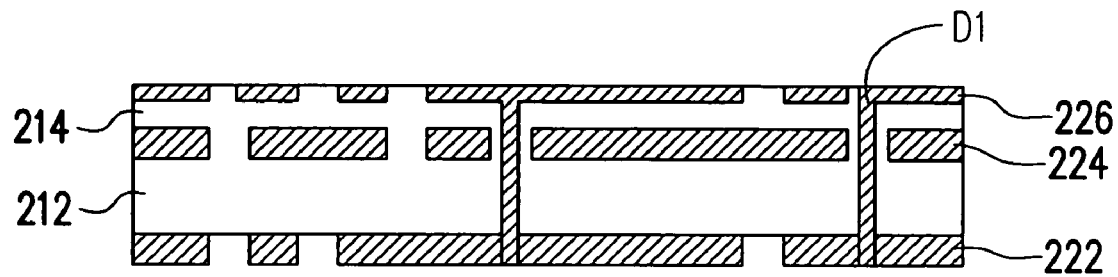

As shown in FIG. 2D, a conductive material is deposited to fill the through hole O1 and form a first plated through hole D1. The first plated through holes D1 form a path for electrically connecting various circuit layers 222, 224 and 226.

Figure 2E:
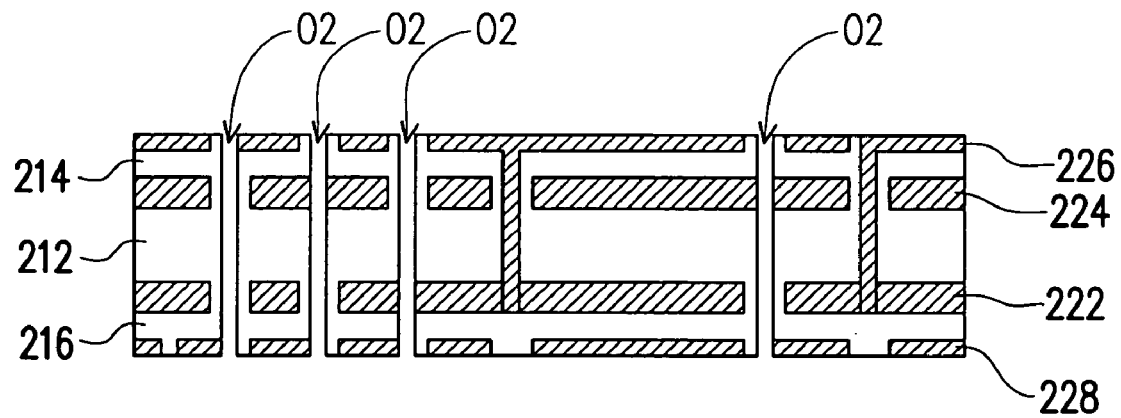

As shown in FIG. 2E, a dielectric layer 216 and a circuit layer 228 are sequentially laminated over the circuit layer 222. The dielectric layer 216 is disposed between the circuit layer 222 and the circuit layer 228. The dielectric layer 216 includes none of the conductive via that only passes a single dielectric layer. Thereafter, at least a through hole O2 that passes through the dielectric layers 212, 214, 216 and the circuit layers 222, 224, 226 and 228 is formed. The method of forming the through hole O2 includes mechanical drilling, for example.

Figure 2F:
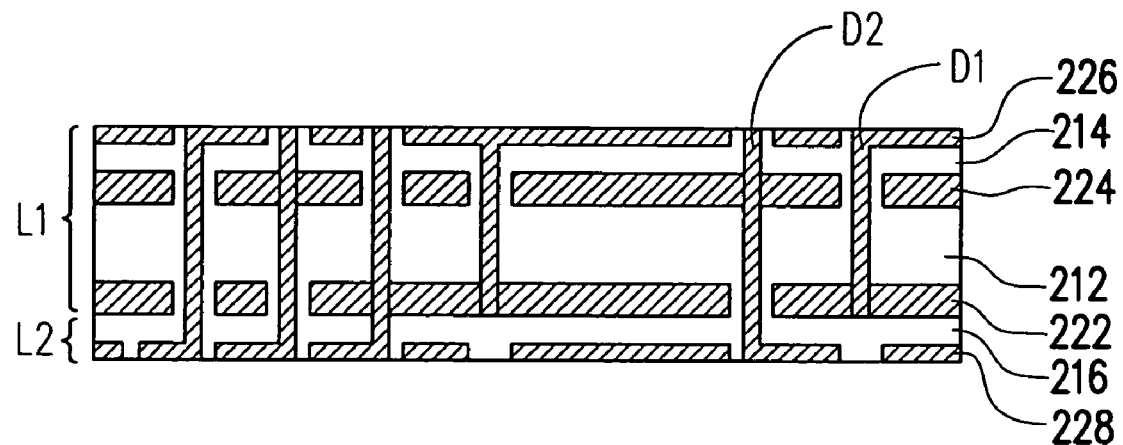

As shown in FIG. 2F, a conductive material is deposited to fill the through hole O2 and form a second plated through hole D2. Thus, the process of forming the circuit board is almost complete.

Figure 2G:
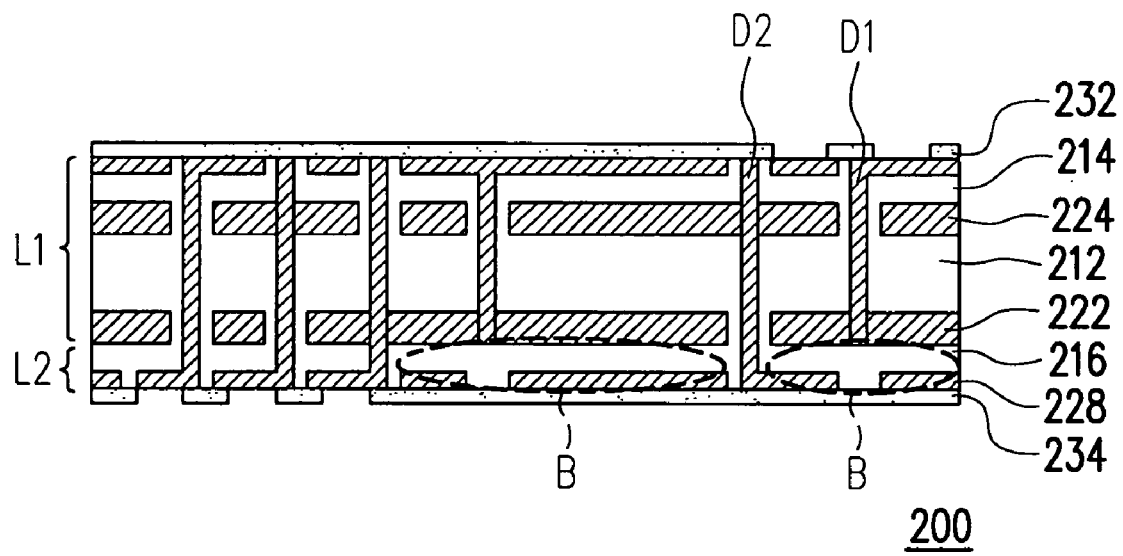

As shown in FIG. 2G, solder mask layers 232 and 234 are formed on the top circuit layer 226 and the bottom circuit layer 228 respectively. The solder mask layers 232 and 234 expose a portion of each of the circuit layer 226 and 228 respectively, wherein the exposed portions of the circuit layer 226 and 228 form a plurality of bonding pads for electrical connection with a chip or other carriers in a subsequent operation.

As shown in FIG. 2G, the circuit board 200 according to one preferred embodiment of the present invention essentially comprises a first laminated structure L1, a first plated through hole D1, a second laminated structure L2, a dielectric layer 216 and a second plated through hole D2. The first laminated structure L1 is disposed above the second laminated structure L2. The first laminated structure L1 comprises a lamination of circuit layers 222, 224, 226 and dielectric layers 212, 214. The first plated through hole D1 passes through the three circuit layers 222, 224 and 226 of the first laminated structure L1. The second laminated structure L2 comprises a circuit layer 228. The second plated through hole D2 passes through the first laminated structure L1 and the second laminated structure L2. The dielectric layers 212 and 214 have none of the conductive via that only passes through a single dielectric layer.

In addition, the dielectric layer 212 is fabricated using a mixture containing fiberglass and a resin so that the circuit board 200 is structurally reinforced. Moreover, the dielectric layers 214 and 216 are fabricated using a resin, for example.

Because the first plated through hole D1 passes through the first laminated structure L1, the area labeled 'B' in FIG. 2G can be used for routing other circuits. Hence, the circuit board 200 can have a higher degree of wiring integration.

Figure 3A:
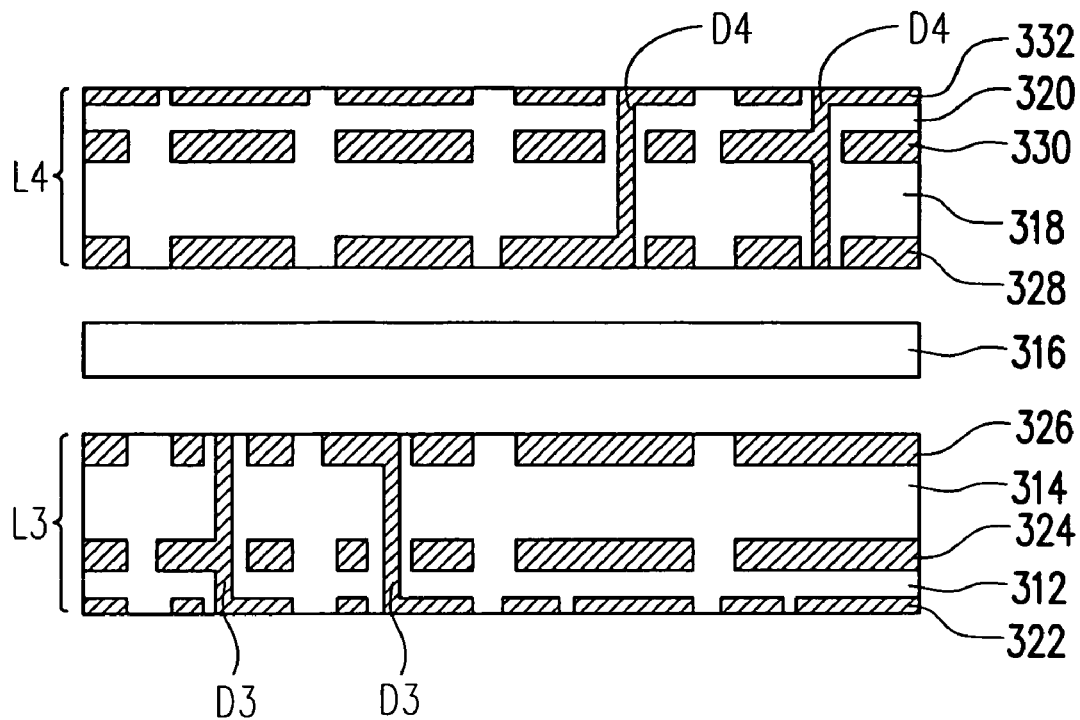
FIGS. 3A and 3B are schematic cross-sectional views showing the steps for fabricating a circuit board according to another preferred embodiment of the present invention.
Figure 3B:
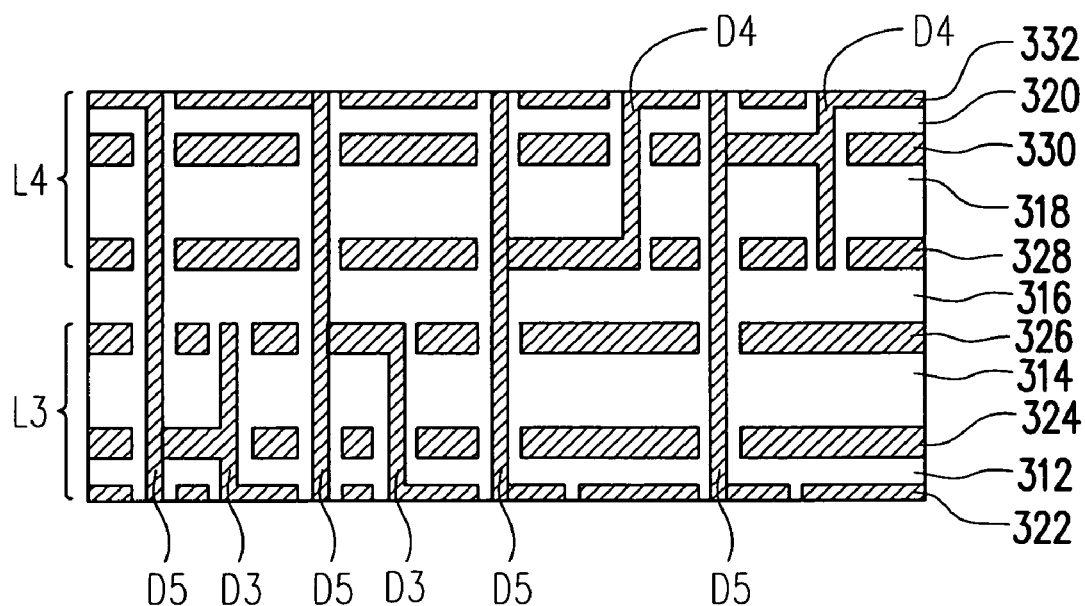

FIGS. 3A and 3B are schematic cross-sectional views showing the steps for fabricating a circuit board according to another preferred embodiment of the present invention. As shown in FIGS. 3A and 3B, the process of fabricating the circuit board according to the present embodiment includes providing a first laminated structure L3 and a second laminated structure L4.

As shown in FIG. 3A, the first laminated structure L3 comprises three circuit layers 322, 324 and 326 and two dielectric layers 312 and 314 alternately laminated together. The dielectric layers 312 and 314 have none of the conductive via that only passes through a single dielectric layer. The first laminated structure L3 has a plurality of first plated through holes D3 that passes through the first laminated structure L3.

The second laminated structure L4 comprises three circuit layers 328, 330 and 332 and two dielectric layers 318 and 320 alternately laminated together. The dielectric layers 318 and 320 have none of the conductive via that only passes through a single dielectric layer. The second laminated structure L4 has a plurality of second plated through holes D4 that passes through the second laminated structure L4.

Thereafter, the first laminated structure L3 and the second laminated structure L4 are laminated on each side of a dielectric layer 316. The dielectric layer 316 has none of the conductive via that passes through a single dielectric layer. Then, at least one third plated through hole D5 that passes through the first laminated structure L3, the second laminated structure L4 and the dielectric layer 316 is formed. Up to this stage, the process of fabricating a circuit board 300 is almost complete.

As shown in FIG. 3B, the circuit board 300 in another preferred embodiment of the present invention essentially comprises a first laminated structure L3, a dielectric layer 316, a second laminated structure L4 and a plurality of third plated through holes D5. The second laminated structure L4 is disposed over the first laminated structure L3. The third plated through holes D5 passes through the first laminated structure L3, the dielectric layer 316 and the second laminated structure L4. The first laminated structure L3 and the second laminated structure L4 have a fine structure identical to the aforementioned description. The dielectric layers 314 and 318 are fabricated using a mixture containing fiberglass and a resin so that the circuit board 300 is structurally reinforced. Moreover, the dielectric layers 312, 316 and 320 are fabricated using a resin, for example. Because the first plated through holes D3 and the second plated through holes D4 do not pass through the entire circuit board 300, other areas of the circuit board 300 can be used for routing other circuits. Hence, the circuit board 300 can have a higher degree of wiring integration.

It should be noted that the four-layered circuit board and the six-layered circuit board in the aforementioned embodiments served as an illustration only and should not be used to limit the scope of the present invention. The present invention can be applied to a circuit board having five layers or seven and more layers. In addition, the spirit of the present invention is to form conductive material filled plated through holes in various laminated structures before laminating the laminated structures together. After that, through holes passing through the laminated structures are formed and then the through holes are filled to form plated through holes that pass through all the laminated structures. Therefore, there is no blind via between various neighboring circuit layers in the circuit board of the present invention.

In summary, because some of the plated through holes in the present invention do not pass through the entire circuit board, the emptied space can accommodate the connection between two neighboring circuit lines that carry an identical signal, or the routing for other circuits. Thus, the difficulty of routing circuit lines is reduced significantly and the wiring density can be increased. In some cases, a conventional package having a six-layered circuit board can even be replaced by a four-layered circuit board according to the present invention, thereby reducing the production time and saving production cost. Moreover, with an increase in the available space inside the circuit board, the length, width and separation of various circuit lines inside the circuit board can be flexibly adjusted on demand and the integrity of the ground plane and the power plane is increased. Ultimately, the circuit board can have a better electrical performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process of fabricating a circuit board, comprising the steps of:

providing a first laminated structure having at least three first circuit layers and at least two first dielectric layers, wherein the first circuit layers and the first dielectric layers are alternately laminated wit one of the first dielectric layers sandwiched between two neighboring ones of the first circuit layers, and none of the first dielectric layers has a conductive via that only passes through a single one of the first dielectric layers;

forming at least a plated through hole that passes through the first laminated structure;

laminating a middle dielectric layer and a second laminated structure over the first laminated structure, wherein the middle dielectric layer is disposed between the first laminated structure and the second laminated structure; and forming at least a second plated trough hole tat passes through the first laminated structure, the middle dielectric layer and the second laminated structure.

2. The process of claim 1, wherein the second laminated structure has at least a second circuit layer.

3. The process of claim 1, wherein the second laminated structure has at least three second circuit layers and at least two dielectric layers such that the second circuit layers and the second dielectric layer are alternately laminated with one of the second dielectric layers sandwiched between two neighboring ones of the second circuit layers, and before laminating the second laminated structure, further comprises forming at least a third plated through hole that passes through the second laminated structure, and furthermore, before forming the third plated through hole, none of the second dielectric layers have a conductive via that only passes through a single one of the second dielectric layers.

4. The process of claim 3, wherein the step of forming the third plated through hole comprising:

forming at least a third through hole that passes through the second laminated structure; and filling the third through hole with a conductive material to form the third plated through hole.

5. The process of claim 4, wherein the step of forming the third through hole comprises performing a mechanical drilling process.

6. The process of claim 1, wherein the step of forming the second plated through hole comprising:

forming at least a second through hole that passes through the first laminated structure, the middle dielectric layer and the second laminated structure; and filling the second through hole with a conductive material to form the second plated through hole.

7. The process of claim 6, wherein the step of forming the second through hole comprises performing a mechanical drilling process.

8. The process of claim 1, wherein the step of forming the first plated through hole comprising:

forming at least a first through hole that passes though the first laminated structure; and filling the first through hole with a conductive material to form the first plated through hole.

9. The process of claim 8, wherein the step of forming the first through hole comprises performing a mechanical drilling process.

10. A process of manufacturing a circuit board, at comprising:
- providing a substrate, wherein the substrate has a first dielectric layer, a first conductive layer, and a second conductive layer;
- patterning the first conductive layer and the second conductive layer such that the first conductive layer becomes a first circuit layer and the second conductive layer becomes a second circuit layer;
- laminating a second dielectric layer and a third circuit layer on the second circuit layer;
- forming at least one first through hole passing through the first circuit layer, the second circuit layer, the third circuit layer, the first dielectric layer, and the second dielectric layer;
- filling the first through hole with conductive materials;
- laminating a third dielectric layer and a fourth circuit layer on the first circuit layer;
- forming at least one second through hole passing through the first circuit layer, the second circuit layer, the third circuit layer, the fourth circuit layer, the first dielectric layer, the second dielectric layer, and the third dielectric layer; and
- filling the second through hole with conductive materials, wherein none of the dielectric layers has a conductive via that only passes through one single dielectric layer.

11. The process of claim 10, wherein the substrate is made at least by the following steps:
- providing a first dielectric layer;
- laminating a first conductive layer an the first dielectric layer; and
- laminating a second conductive layer on the first dielectric layer.

12. The process of claim 10, wherein the patterning step comprises photolithographic and etching processes.

13. The process of claim 10, wherein the step of forming the through holes comprises a mechanical drilling.

14. The process of claim 10, wherein the step of filling the through holes comprises a deposition process.

15. The process of claim 10, further comprising:
- forming a first solder mark on the first circuit layer; and
- forming a second solder mark on the fourth circuit layer;
- wherein a portion of the first circuit layer and a portion of the fourth circuit layer are exposed.

16. A process of manufacturing a circuit board, at comprising:
- providing a first laminated structure, wherein the first laminated structure is made by a first method comprising at least:
  - providing a substrate, wherein the substrate has a first dielectric layer, a first conductive layer, and a second conductive layer;
  - patterning the first conductive layer and the second conductive layer such that the first conductive layer becomes a first circuit layer and the second conductive layer becomes a second circuit layer;
  - laminating a second dielectric layer and a third circuit layer on the second circuit layer;
  - forming at least one first through hole passing through the first circuit layer, the second circuit layer, the third circuit layer, the first dielectric layer, and the second dielectric layer;
  - filling the first through hole with conductive materials;
  - laminating a third dielectric layer and a fourth circuit layer on the first circuit layer;
  - forming at least one second through hole passing through the first circuit layer, the second circuit layer, the third circuit layer, the fourth circuit layer, the first dielectric layer, the second dielectric layer, and the third dielectric layer; and
  - filling the second through hole with conductive materials,
  - wherein none of the dielectric layers has a conductive via that only passes through one single dielectric layer;
- providing a second laminated structure made by the first method; and
- having the first laminated structure and the second laminated structure laminated on different sides of a middle dielectric layer.

17. The process of claim 16, wherein the substrate is made at least by the following steps:
- providing a first dielectric layer;
- laminating a first conductive layer on the first dielectric layer; and
- laminating a second conductive layer on the first dielectric layer.

18. The process of claim 16, wherein the patterning step comprises photolithographic and etching processes.

19. The process of claim 16, wherein the step of forming the through holes comprises a mechanical drilling.

20. The process of claim 16, wherein the step of filling the through holes comprises a deposition process.

* * * * *